(12) United States Patent
Li et al.

(10) Patent No.: US 12,193,214 B2
(45) Date of Patent: Jan. 7, 2025

(54) MANUFACTURING METHOD FOR MEMORY STRUCTURE

(71) Applicant: Winbond Electronics Corp., Taichung (TW)

(72) Inventors: Shu-Ming Li, Taichung (TW); Tzu-Ming Ou Yang, Taichung (TW); Chung-Ming Yang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 159 days.

(21) Appl. No.: 17/711,056

(22) Filed: Apr. 1, 2022

(65) Prior Publication Data

US 2022/0223600 A1    Jul. 14, 2022

Related U.S. Application Data

(62) Division of application No. 16/908,736, filed on Jun. 23, 2020, now Pat. No. 11,342,332.

(51) Int. Cl.
*H10B 12/00*        (2023.01)

(52) U.S. Cl.
CPC ....... *H10B 12/315* (2023.02); *H10B 12/0335* (2023.02); *H10B 12/482* (2023.02)

(58) Field of Classification Search
None
See application file for complete search history.

(56) References Cited

U.S. PATENT DOCUMENTS

| | | | |
|---|---|---|---|
| 6,159,818 A | 12/2000 | Durcan et al. | |
| 6,188,099 B1* | 2/2001 | Nakatani | H10B 12/033 257/311 |
| 6,215,144 B1* | 4/2001 | Saito | H01L 21/7687 257/305 |
| 6,235,572 B1* | 5/2001 | Kunitomo | H01L 21/022 438/785 |
| 2004/0079981 A1 | 4/2004 | Hirokawa et al. | |
| 2020/0082886 A1* | 3/2020 | Huo | H01L 29/42384 |

FOREIGN PATENT DOCUMENTS

JP        2000174227        6/2000

OTHER PUBLICATIONS

"Office Action of China Counterpart Application", issued on May 11, 2023, p. 1-p. 7.

* cited by examiner

*Primary Examiner* — Steven M Christopher
(74) *Attorney, Agent, or Firm* — JCIPRNET (57) ABSTRACT

A manufacturing method for a memory structure including the following steps is provided. A bit line structure is formed on the substrate. A contact structure is formed on the substrate on one side of the bit line structure. A capacitor structure is formed on the contact structure. The capacitor structure includes a first electrode, a second electrode and an insulating layer. The first electrode is disposed on the contact structure in a misaligned manner. The first electrode includes a first bottom surface and a second bottom surface. The first bottom surface is lower than the second bottom surface. The first bottom surface is disposed on the contact structure. The second electrode is located on the first electrode. The insulating layer is disposed between the first electrode and the second electrode.

19 Claims, 11 Drawing Sheets

MANUFACTURING METHOD FOR MEMORY STRUCTURE

CROSS-REFERENCE TO RELATED APPLICATION

This application is a divisional application of and claims the priority benefit of U.S. application Ser. No. 16/908,736, filed on Jun. 23, 2020. The entirety of the above-mentioned patent application is hereby incorporated by reference herein and made a part of this specification.

BACKGROUND

Field of the Disclosure

The disclosure relates to a semiconductor structure and a manufacturing method therefor, and particularly relates to a memory structure and a manufacturing method therefor.

Description of Related Art

As the memory device gradually shrinks, the overlay window between the upper and lower conductive layers adjacent to each other also becomes smaller, so misalignment is likely to occur. As a result, when an overlay shift occurs between the upper and lower conductive layers, electrical defects (e.g., circuit bridging, etc.) are often generated in the memory device.

SUMMARY OF THE DISCLOSURE

The disclosure provides a memory structure and a manufacturing method therefor, which can effectively increase the overlay window.

The disclosure provides a memory structure, including a substrate, a bit line structure, a contact structure and a capacitor structure. The bit line structure is located on the substrate. The contact structure is located on the substrate on one side of the bit line structure. The capacitor structure is located on the contact structure. The capacitor structure includes a first electrode, a second electrode and an insulating layer. The first electrode includes a first bottom surface and a second bottom surface. The first bottom surface is lower than the second bottom surface. The first bottom surface is only located on a part of the contact structure. The second electrode is located on the first electrode. The insulating layer is disposed between the first electrode and the second electrode.

The disclosure provides a manufacturing method for memory structure, including the following steps. A bit line structure is formed on the substrate. A contact structure is formed on the substrate on one side of the bit line structure. A capacitor structure is formed on the contact structure. The capacitor structure includes a first electrode, a second electrode and an insulating layer. The first electrode is disposed on the contact structure in a misaligned manner. The first electrode includes a first bottom surface and a second bottom surface. The first bottom surface is lower than the second bottom surface. The first bottom surface is disposed on the contact structure. The second electrode is located on the first electrode. The insulating layer is disposed between the first electrode and the second electrode.

Based on the above, in the above memory structure and manufacturing method therefor, the first bottom surface of the first electrode is lower than the second bottom surface of the first electrode. In this way, even if overlay shift occurs between the first electrode and the contact structure, it is not easy to form a bridging path between two adjacent contact structures. Therefore, through the above-mentioned structural design of the first electrode, the overlay window between the first electrode and the contact structure can be effectively improved, and electrical defects (e.g., circuit bridging) that are generated due to overlay shift can be prevented.

In order to make the above-mentioned features and advantages of the disclosure more obvious and understandable, the embodiments are specifically described below in detail in conjunction with the accompanying drawings.

DESCRIPTION OF EMBODIMENTS

FIG. 1A to FIG. 1I are cross-sectional views of a manufacturing process of a memory structure according to an embodiment of the disclosure.

Figure 1A:
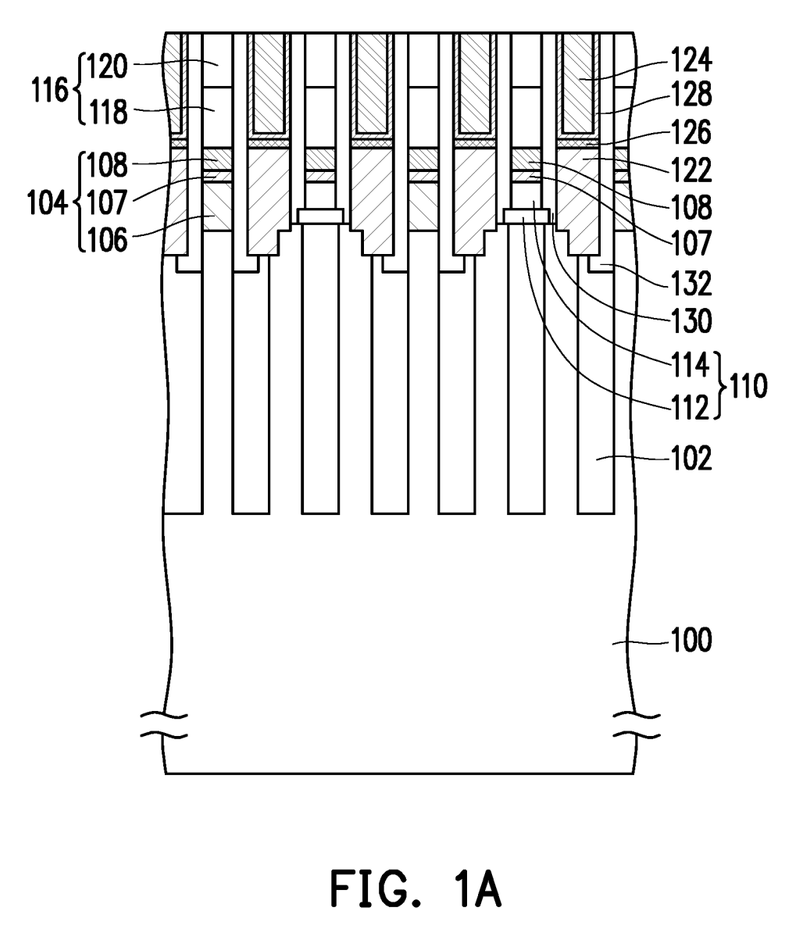
FIG. 1A to FIG. 1I are cross-sectional views of a manufacturing process of a memory structure according to an embodiment of the disclosure.

Referring to FIG. 1A, a substrate 100 is provided. The substrate 100 may be a semiconductor substrate, such as a silicon substrate. There may be an isolation structure 102 in the substrate 100. The isolation structure 102 is, for example, a shallow trench isolation (STI). In addition, a desired doped region (not shown) may be formed in the substrate 100 according to requirement.

A bit line structure 104 is formed on the substrate 100. The bit line structure 104 may include a contact 106 and a wire 108. The contact 106 is disposed on the substrate 100. The material of the contact 106 is, for example, doped polysilicon. The wire 108 is disposed on the contact 106. A part of the wire 108 may be disposed on a dielectric structure 110. The material of the wire 108 is, for example, metal such as tungsten. The dielectric structure 110 may be a single-layer structure or a multi-layer structure. In this embodiment, the dielectric structure 110 is exemplified as a multi-layer structure including the dielectric layer 112 and the dielectric layer 114, but the disclosure is not limited thereto. The dielectric layer 112 is disposed on the isolation structure 102. The material of the dielectric layer 112 is, for example, silicon oxide. The dielectric layer 114 is disposed on the dielectric layer 112. The material of the dielectric layer 114 is, for example, silicon nitride. In addition, the bit line structure 104 may further include a barrier layer 107. The barrier layer 107 is disposed between the wire 108 and the contact 106. A part of the barrier layer 107 may be disposed between the wire 108 and the dielectric structure 110. The material of the barrier layer 107 is, for example, titanium (Ti), titanium nitride (TiN), or a combination thereof.

In addition, a hard mask layer 116 may be formed on the bit line structure 104. The hard mask layer 116 may be a single-layer structure or a multi-layer structure. In this embodiment, the hard mask layer 116 is exemplified as a multi-layer structure including the mask layer 118 and the mask layer 120, but the disclosure is not limited thereto. The mask layer 118 is disposed on the wire 108. The material of the mask layer 118 is, for example, silicon nitride. The mask layer 120 is disposed on the mask layer 118. The material of the mask layer 120 is, for example, silicon nitride.

In addition, a contact 122 may be formed on the substrate 100 on one side of the bit line structure 104. The material of the contact 122 is, for example, doped polysilicon. In addition, a contact material layer 124 may be formed on the contact 122. The material of the contact material layer 124 is, for example, metal such as tungsten. A metal silicide layer 126 may be formed on the contact 122, and the metal silicide layer 126 is disposed between the contact 122 and the contact material layer 124. The material of the metal silicide layer 126 is, for example, cobalt silicide (CoSi) or nickel silicide (NiSi). Furthermore, a barrier layer 128 may be formed between the contact material layer 124 and the metal silicide layer 126. The material of the barrier layer 128 is, for example, Ti, TiN, or a combination thereof.

In addition, the spacer layer 130 may be formed on a side wall of the contact material layer 124, and the spacer layer 132 may be formed on the other side wall of the contact material layer 124. The spacer layer 130 and the spacer layer 132 may be a single-layer structure or a multi-layer structure, respectively. For example, the spacer layer 130 and the spacer layer 132 may be a silicon nitride layer, a composite layer of silicon oxide layer/silicon nitride layer (NO), or a composite layer of silicon nitride layer/silicon oxide layer/silicon nitride layer (NON).

Figure 1B:
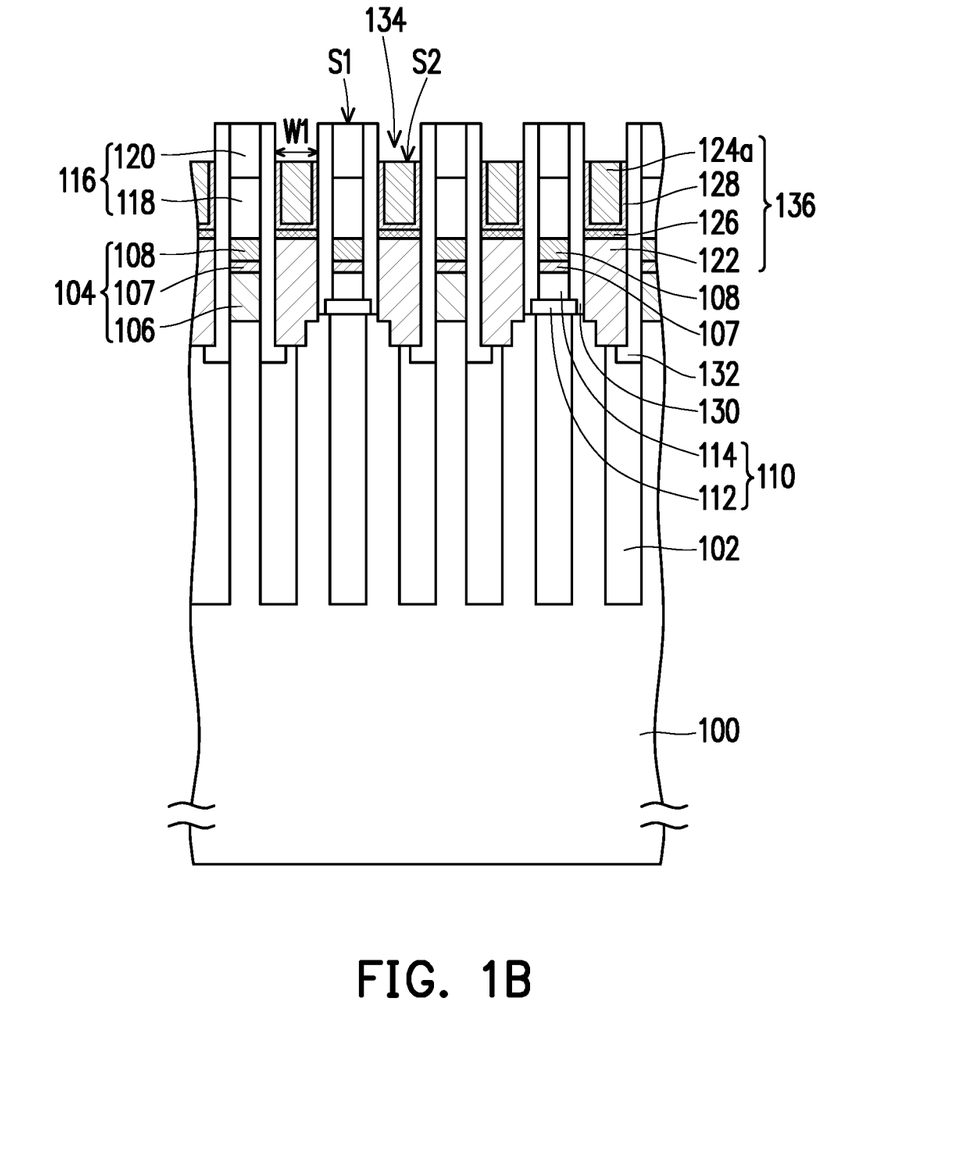

Referring to FIG. 1B, the contact material layer 124 may be etched to form a contact 124a, and an opening 134 is formed above the contact 124a, so that the top surface S1 of the hard mask layer 116 may be higher than the top surface S2 of the contact 124a. That is, the top surface S1 of the hard mask layer 116 may be higher than the top surface S2 of the contact structure 136. The opening 134 may have a width W1. The etching process performed on the contact material layer 124 is, for example, a dry etching process. In addition, a part of the barrier layer 128 exposed by the opening 134 may be removed. In this way, the contact structure 136 may be formed on the substrate 100 on one side of the bit line structure 104. The contact structure 136 may include the contact 122 and the contact 124a. The contact 122 is disposed on the substrate 100. The contact 124a is disposed on the contact 122. In addition, the contact structure 136 may further include at least one of the metal silicide layer 126 and the barrier layer 128. The metal silicide layer 126 is disposed between the contact 122 and the contact 124a. The barrier layer 128 is disposed between the contact 124a and the metal silicide layer 126.

Figure 1C:
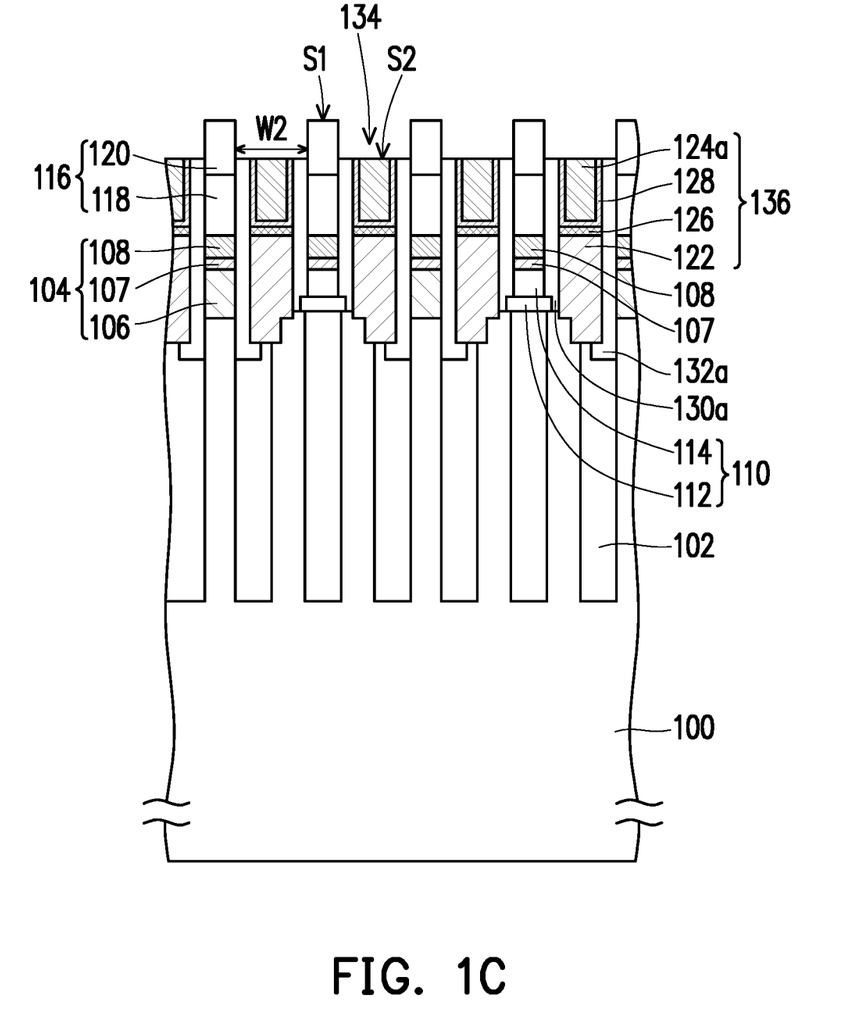

Referring to FIG. 1C, after the contact 124a is formed, a part of the spacer layer 130 and a part of the spacer layer 132 exposed by the opening 134 can be removed through a wet etching process to form the spacer wall 130a and the spacer wall 132a, and the width of the opening 134 can be enlarged. For example, the width of the opening 134 may be enlarged from the width W1 (FIG. 1B) to the width W2 (FIG. 1C).

Figure 1D:
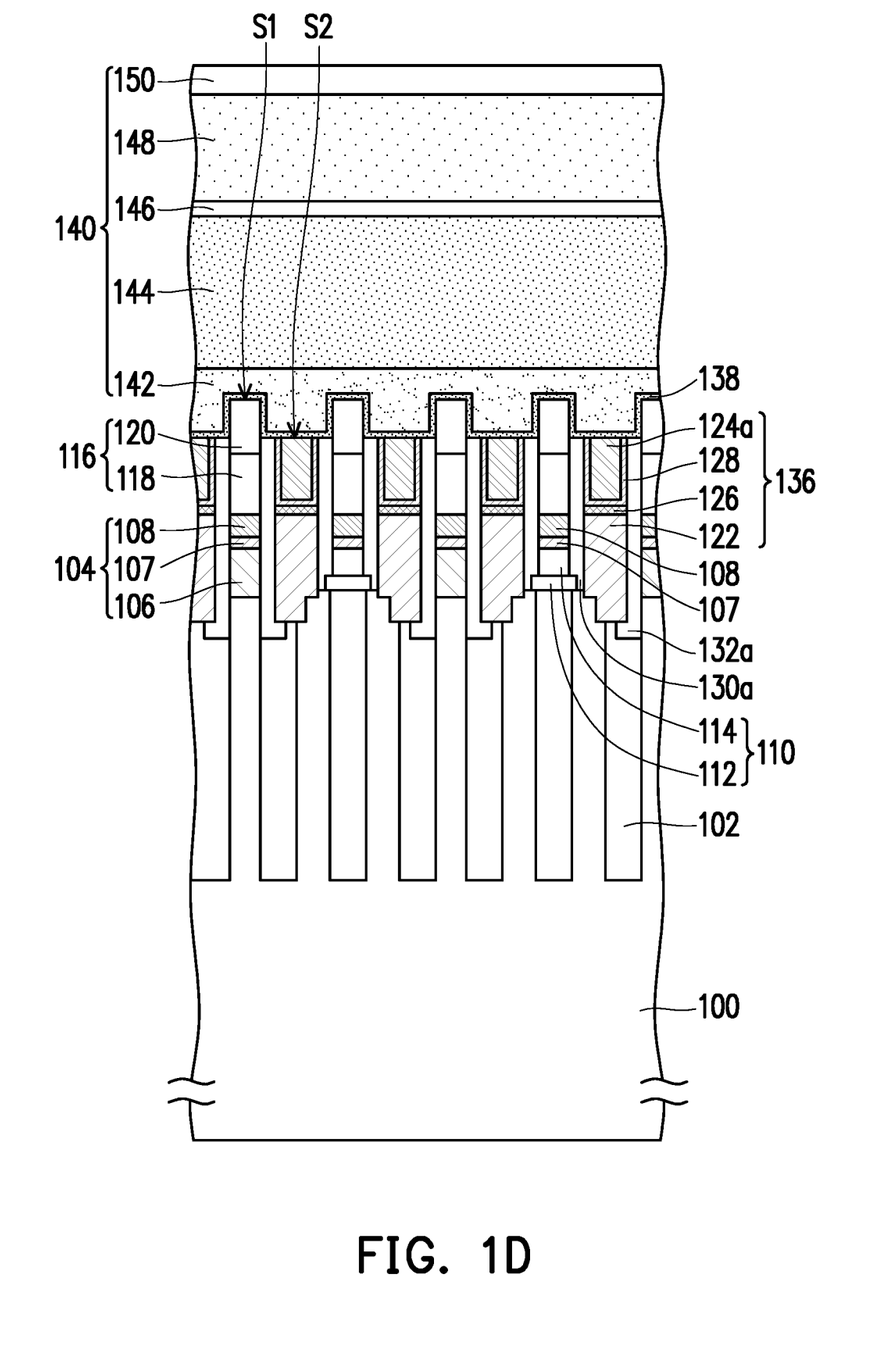

Referring to FIG. 1D, an etch stop layer 138 may be formed on the surface of the opening 134. The etch stop layer 138 is not filled in the opening 134. In an embodiment, the etch stop layer 138 may be conformally formed on the surface of the opening 134. The material of the etch stop layer 138 is, for example, silicon nitride. The forming method of the etch stop layer 138 is, for example, a chemical vapor deposition method.

Next, the dielectric structure 140 filled in the opening 134 may be formed. The dielectric structure 140 may include a dielectric layer 142 and a dielectric layer 144 located on the dielectric layer 142. The dielectric layer 142 is filled in the opening 134. The dielectric layer 142 may be a spin on dielectric (SOD) material. The material of the dielectric layer 142 is, for example, silicon oxide. The material of the dielectric layer 144 is, for example, silicon oxide. The forming method of the dielectric layer 144 is, for example, a chemical vapor deposition method. In addition, the dielectric structure 140 may include at least one of the dielectric layer 146, the dielectric layer 148, and the dielectric layer 150. The dielectric layer 146, the dielectric layer 148, and the dielectric layer 150 are sequentially disposed on the dielectric layer 144. The material of the dielectric layer 146 and the dielectric layer 150 is, for example, silicon nitride. The material of the dielectric layer 148 is, for example, silicon oxide.

Figure 1E:
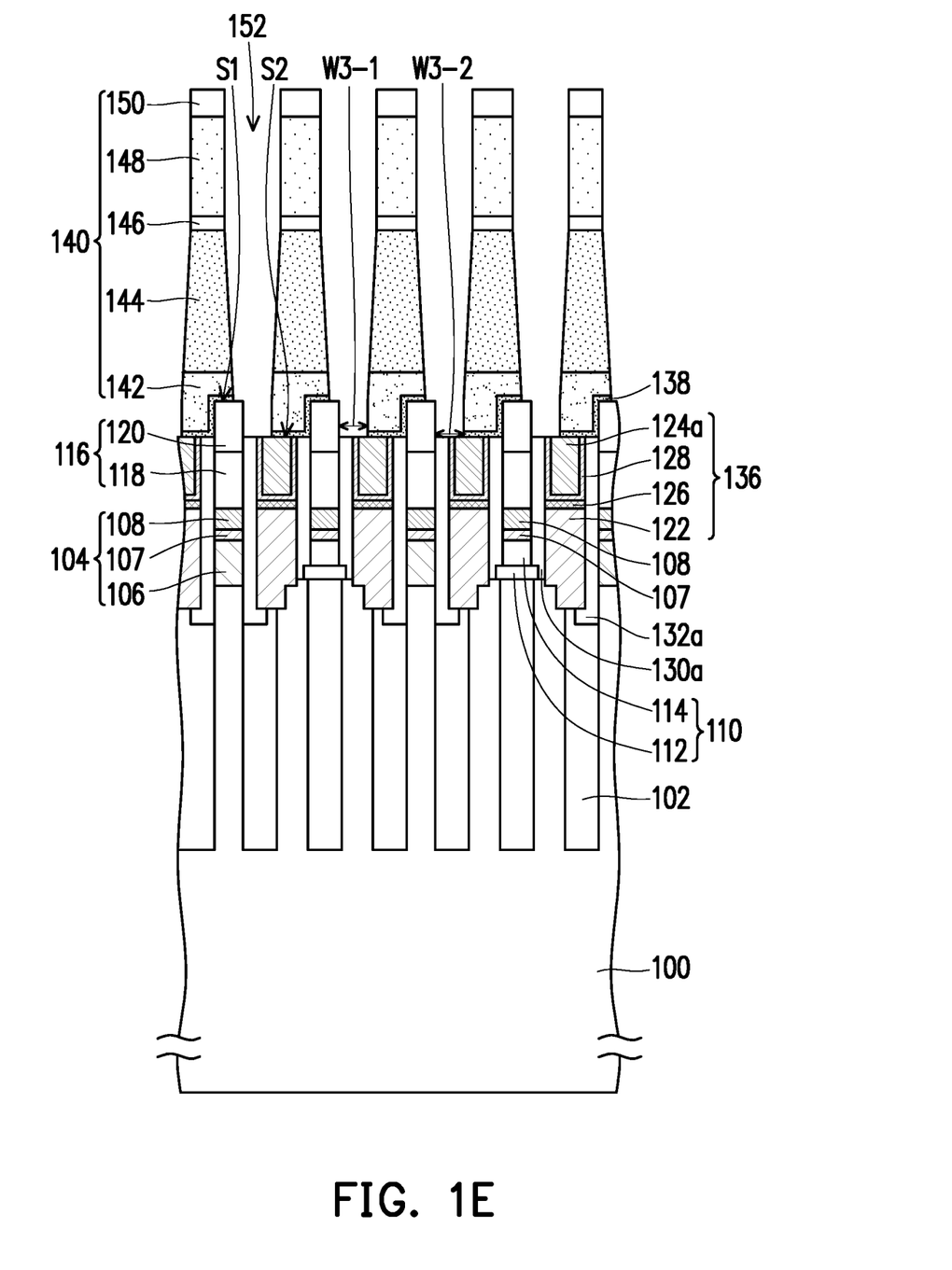

Referring to FIG. 1E, an opening 152 exposing a part of the contact 124a may be formed in the dielectric structure 140. The forming method of the opening 152 is, for example, patterning the dielectric structure 140 by a lithography process and an etching process. The above etching process is, for example, a dry etching process. In addition, a part of the etch stop layer 138 may be removed, so that the opening 152 exposes a part of the contact 124a. The bottom of the opening 152 may have a width W3-1 at the dielectric layer 142, and the bottom of the opening 152 may have a width W3-2 at the etch stop layer 138. In addition, in the process shown in FIG. 1C, the width of the opening 134 can be enlarged to the width W2, thereby facilitating the etching process in FIG. 1E, that is, to facilitate the formation of the opening 152 which exposes a part of the contact 124a.

Figure 1F:
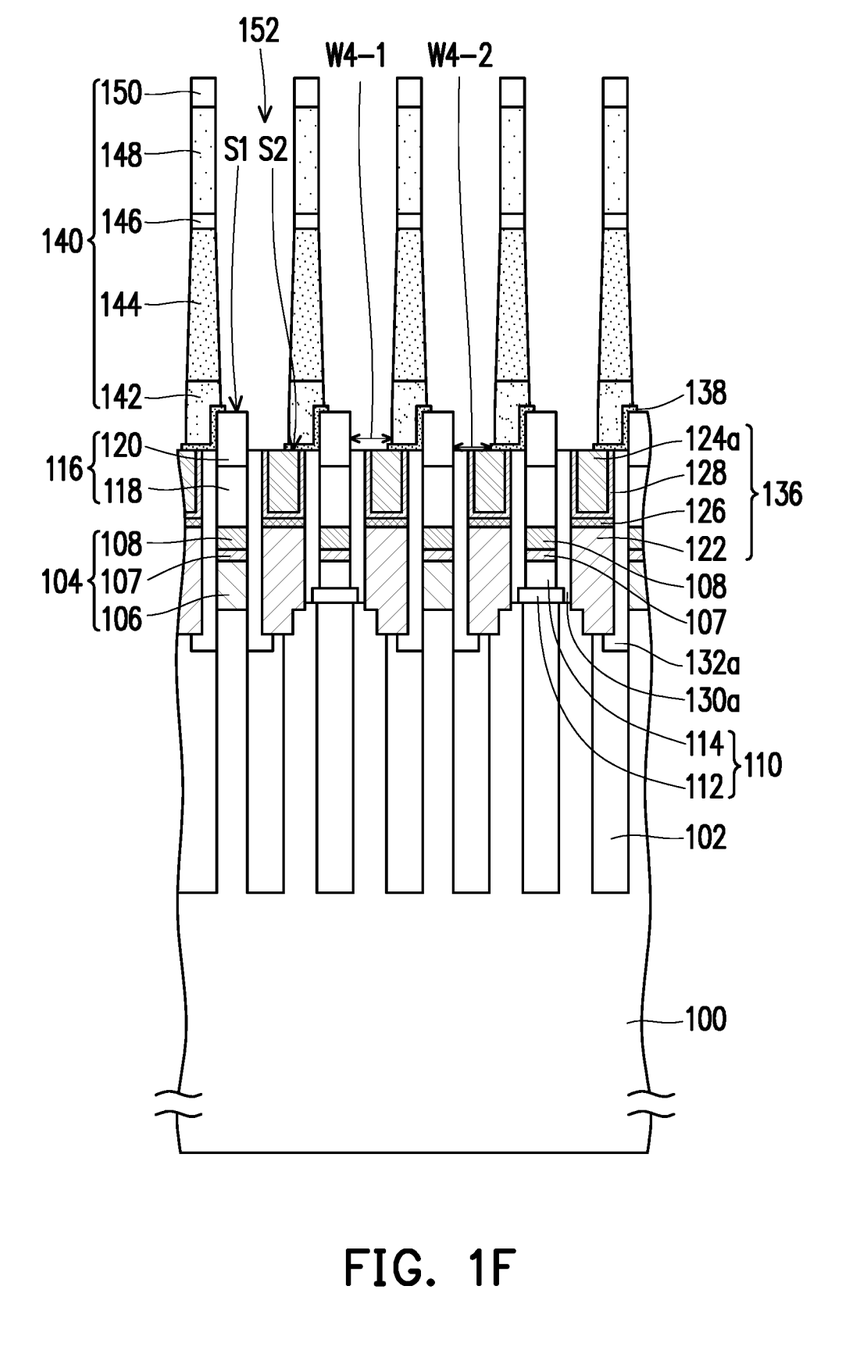

Referring to FIG. 1F, a part of the dielectric structure 140 and a part of the etch stop layer 138 may be removed to enlarge the width of the bottom of the opening 152. For example, the width of the bottom of the opening 152 may be enlarged from the width W3-1 (FIG. 1E) to the width W4-1 (FIG. 1F), thereby helping to increase the capacitance value of the capacitor formed in the opening 152 subsequently. In addition, the width of the bottom of the opening 152 can be enlarged from the width W3-2 (FIG. 1E) to the width W4-2 (FIG. 1F), thereby helping to increase the contact area between the capacitor formed in the opening 152 subsequently and the contact structure 136. The removal method of the partial dielectric structure 140 and the partial etch stop layer 138 is, for example, a wet etching process. The etching rate of the wet etching process performed on the dielectric layer 142 may be greater than the etching rate of the wet etching process performed on the dielectric layer 144. In addition, since the materials of the dielectric layer 142 and the etch stop layer 138 are different, the amount of the dielectric layer 142 removed by the wet etching process may be greater than the amount of the etch stop layer 138 removed by the wet etching process.

Figure 1G:
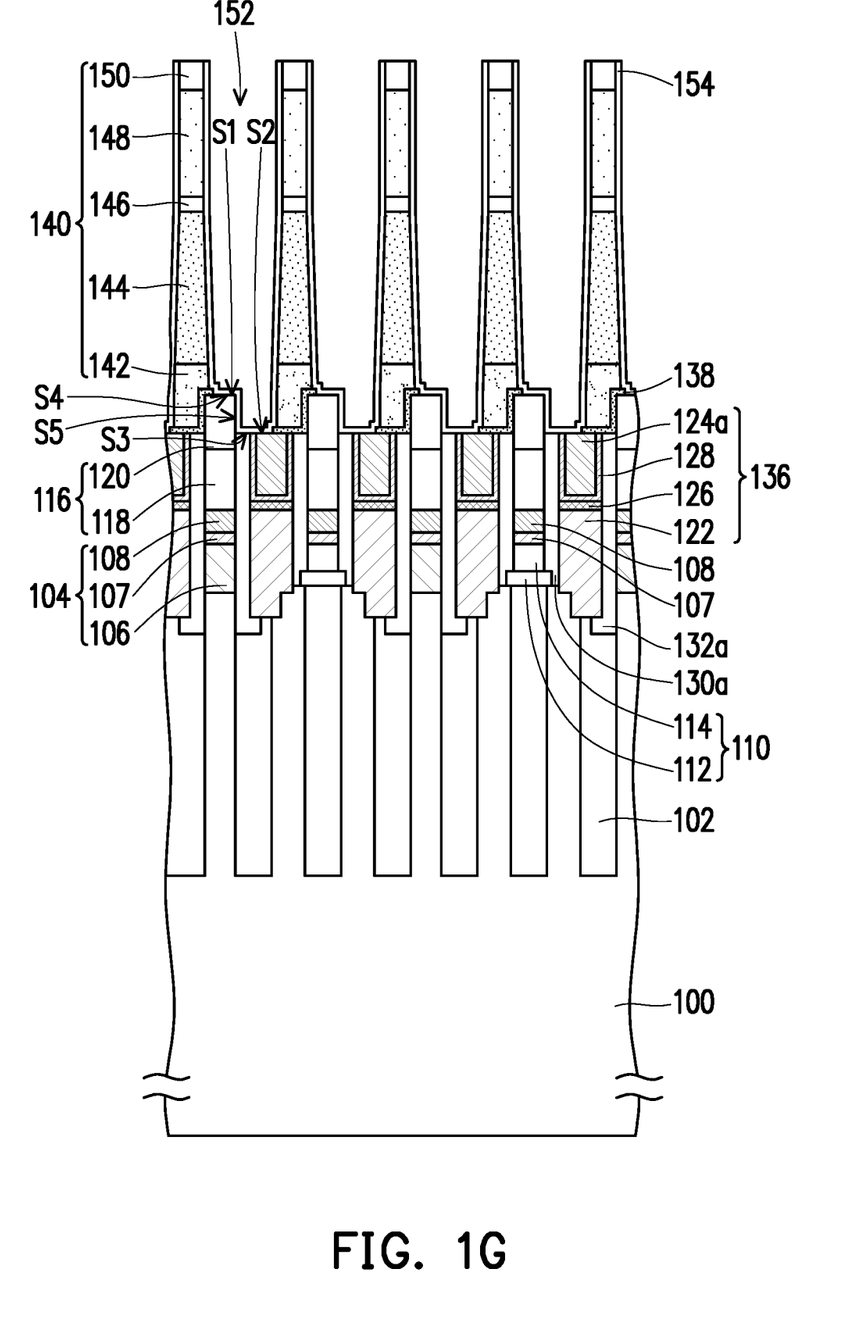

Referring to FIG. 1G, an electrode 154 may be formed conformally in the opening 152. The electrode 154 is disposed on the contact structure 136 in a misaligned manner. The electrode 154 includes a first bottom surface S3 and a second bottom surface S4. The first bottom surface S3 of the electrode 154 is lower than the second bottom surface S4 of the electrode 154. The first bottom surface S3 of the electrode 154 may be disposed on the top surface S2 of the contact structure 136, and the second bottom surface S4 of the electrode 154 may be disposed on the top surface S1 of the hard mask layer 116. For example, the first bottom surface S3 of the electrode 154 may be connected to the top surface S2 of the contact structure 136, and the second bottom surface S4 of the electrode 154 may be connected to the top surface S1 of the hard mask layer 116. In addition, the electrode 154 may further include a connection surface S5. The connection surface S5 is connected between the first bottom surface S3 and the second bottom surface S4. The shape formed by the first bottom surface S3 of the electrode 154, the connection surface S5, and the second bottom surface S4 may be a stepped shape. The material of the electrode 154 is, for example, Ti, TiN, or a combination thereof. The forming method of the electrode 154 is, for example, to form an electrode material layer conformally on the surface of the opening 152 and the top surface of the dielectric structure 140, and then pattern the electrode material layer.

Figure 1H:
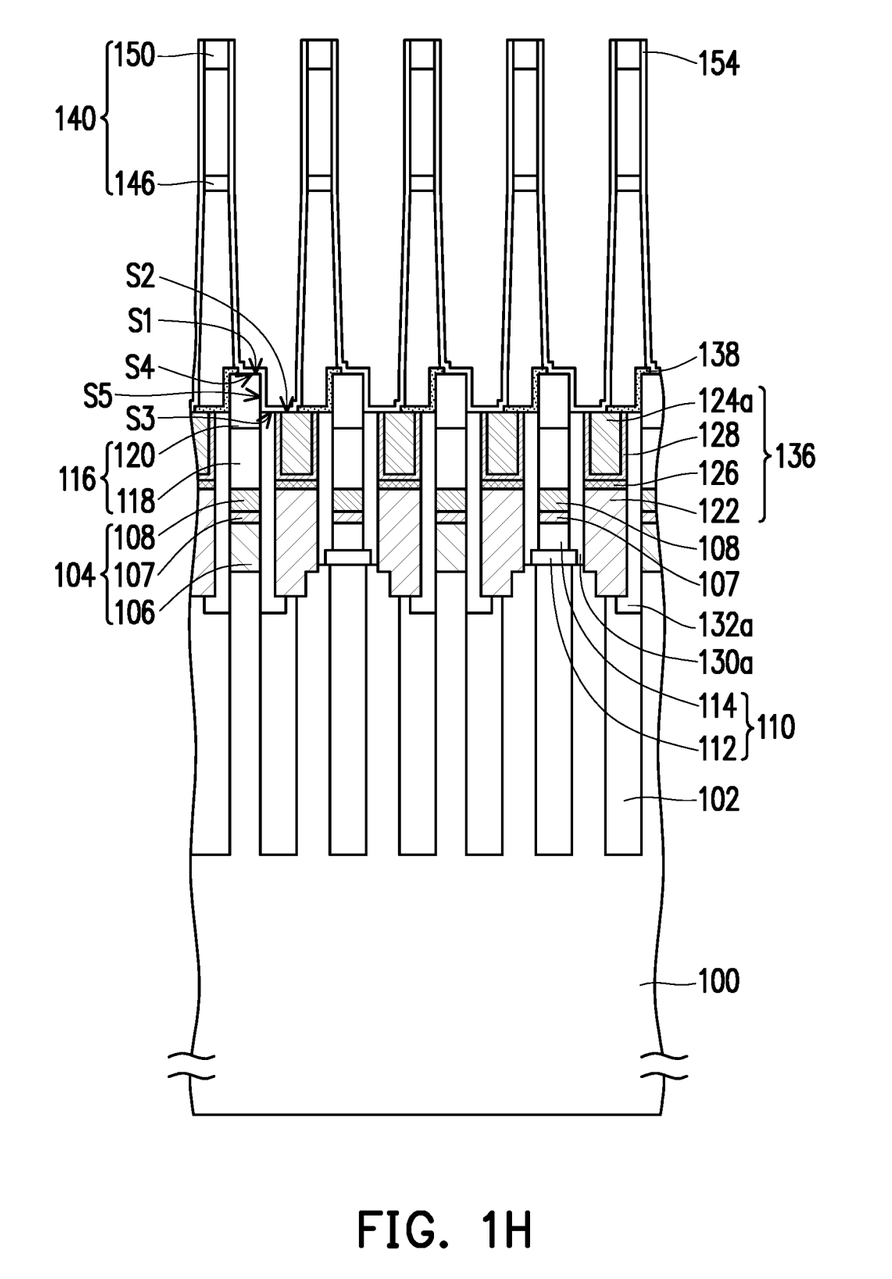

Referring to FIG. 1H, the dielectric layer 142, the dielectric layer 144, and the dielectric layer 148 in the dielectric structure 140 may be removed. The method for removing the dielectric layer 142, the dielectric layer 144, and the dielectric layer 148 is, for example, a wet etching method.

Figure 1I:
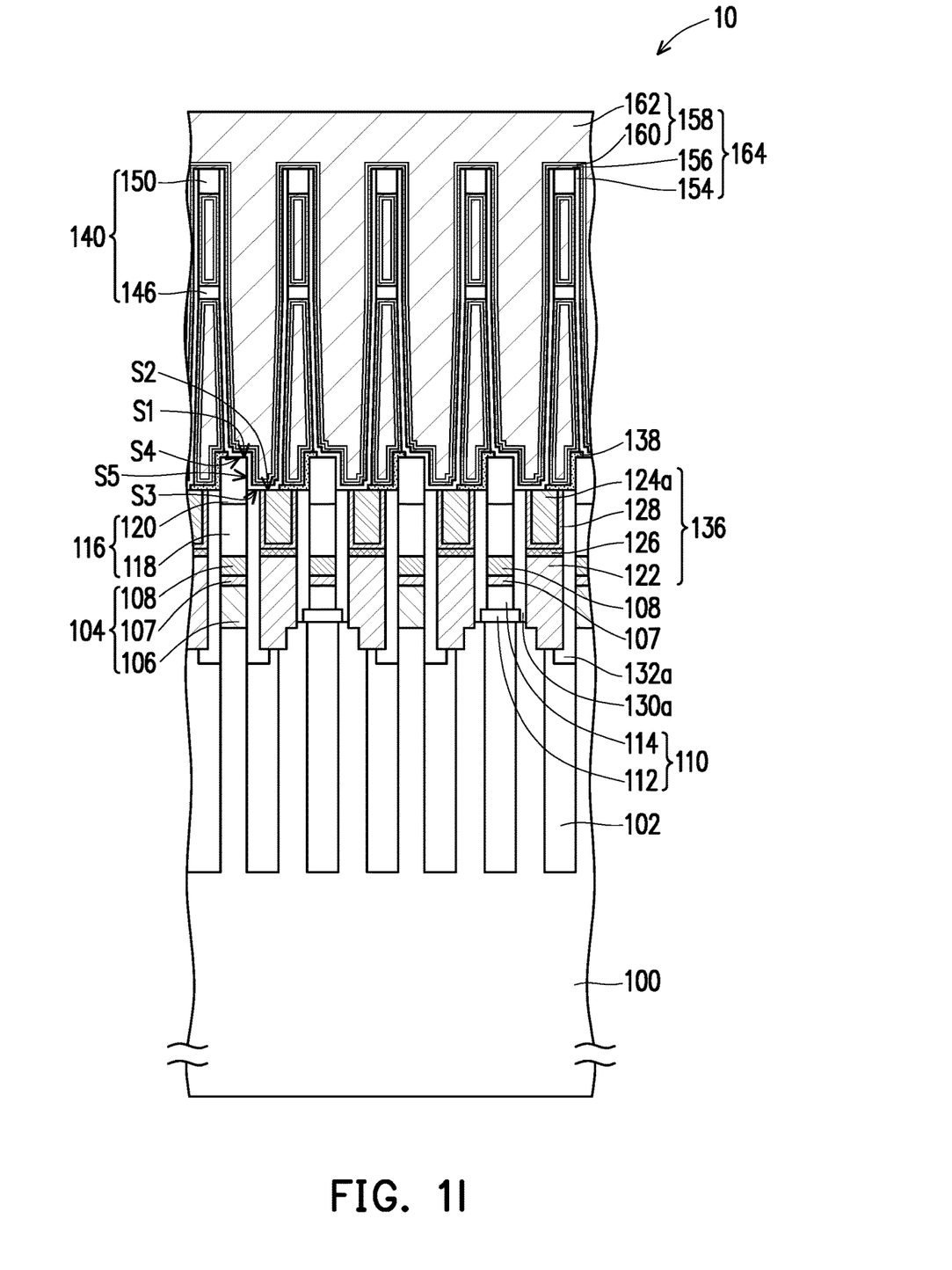

Referring to FIG. 1I, an insulating layer 156 and an electrode 158 may be sequentially formed on the electrode 154. The material of the insulating layer 156 may be a dielectric material, such as a high-k material. The electrode 158 may be a single-layer structure or a multi-layer structure. In this embodiment, the electrode 158 is exemplified as a multi-layer structure including the conductor layer 160 and the conductor layer 162, but the disclosure is not limited thereto. The conductor layer 160 is disposed on the insulating layer 156. The material of the conductor layer 160 is, for example, Ti, TiN, or a combination thereof. The conductor layer 162 is disposed on the conductor layer 160. The material of the conductor layer 162 is, for example, doped silicon germanium (SiGe).

In this way, the capacitor structure 164 may be formed on the contact structure 136. The capacitor structure 164 includes an electrode 154, an electrode 158 and an insulating layer 156. The electrode 158 is disposed on the electrode 154. The insulating layer 156 is disposed between the electrode 154 and the electrode 158.

In the following description, the memory structure 10 of the embodiment will be described with reference to FIG. 1I. In addition, although the method of forming the memory structure 10 is described using the above method as an example, the disclosure is not limited thereto.

Referring to FIG. 1I, the memory structure 10 includes a substrate 100, a bit line structure 104, a contact structure 136, and a capacitor structure 164. In addition, the memory structure 10 may further include at least one of a hard mask layer 116, an etch stop layer 138, a spacer wall 130a and a spacer wall 132a. The memory structure 10 may be a dynamic random access memory (DRAM). The bit line structure 104 is disposed on the substrate 100. The contact structure 136 is located on the substrate 100 on one side of the bit line structure 104. The capacitor structure 164 is disposed on the contact structure 136. The capacitor structure 164 includes an electrode 154, an electrode 158 and an insulating layer 156. The electrode 154 includes a first bottom surface S3 and a second bottom surface S4. The first bottom surface S3 of the electrode 154 is lower than the second bottom surface S4 of the electrode 154. The first bottom surface S3 of the electrode 154 is only disposed on a part of the contact structure 136. The electrode 154 may further include a connection surface S5. The connection surface S5 is connected between the first bottom surface S3 and the second bottom surface S4. The shape formed by the first bottom surface S3 of the electrode 154, the connection surface S5, and the second bottom surface S4 may be a stepped shape. The first bottom surface S3 of the electrode 154 may be connected to the top surface S2 of the contact structure 136. The electrode 158 is disposed on the electrode 154. The insulating layer 156 is disposed between the electrode 154 and the electrode 158. The hard mask layer 116 is disposed on the bit line structure 104. The top surface S1 of the hard mask layer 116 may be higher than the top surface S2 of the contact structure 136. The second bottom surface S4 of the electrode 154 may be connected to the top surface S1 of the hard mask layer 116. The etch stop layer 138 is located on the contact structure 136 and exposes a part of the top surface S2 of the contact structure 136. The spacer wall 130a is located on a side wall of the contact structure 136. The spacer wall 132a is located on the other side wall of the contact structure 136.

For the remaining components in the memory structure 10, reference may be made to the description of the above embodiment. In addition, the materials, arrangement methods, forming methods, and functions of the components in the memory structure 10 have been described in detail in the foregoing embodiments, and will not be repeated here.

Based on the above embodiment, it can be obtained that in the above memory structure 10 and the manufacturing method therefor, the first bottom surface S3 of the electrode 154 is lower than the second bottom surface S4 of the electrode 154. In this way, even if overlay shift occurs between the electrode 154 and the contact structure 136, it is not easy to form a bridging path between two adjacent contact structures 136. Therefore, through the above structural design of the electrode 154, the overlay window between the electrode 154 and the contact structure can be effectively improved, and electrical defects (such as circuit bridging) that is generated due to the overlay shift can be prevented.

Figure 2A:
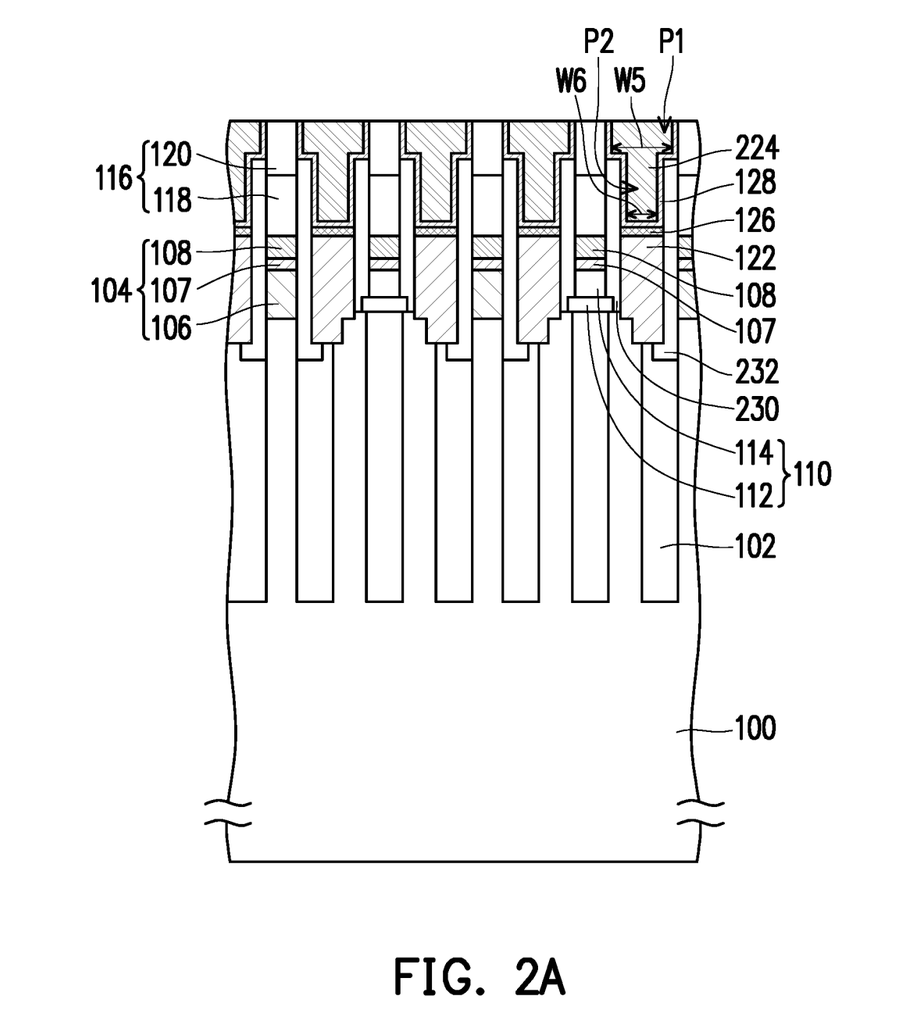
FIG. 2A to FIG. 2B are cross-sectional views of a manufacturing process of a memory structure according to another embodiment of the disclosure.
Figure 2B:
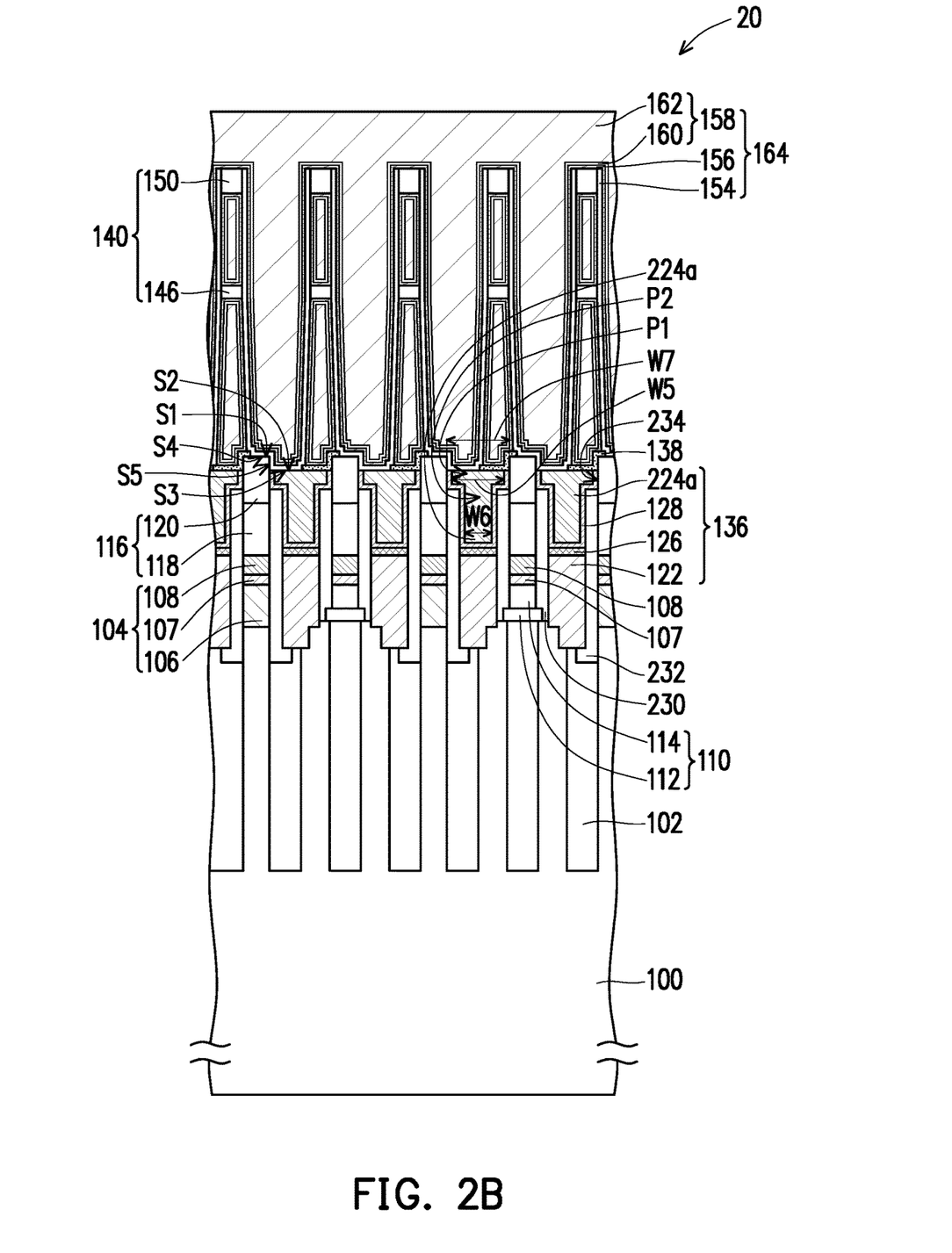

FIG. 2A to FIG. 2B are cross-sectional views of a manufacturing process of a memory structure according to another embodiment of the disclosure.

Please refer to FIG. 1A and FIG. 2A, the difference between the structure of FIG. 1A and the structure of FIG. 2 is as follows. In the structure of FIG. 2, the width W5 of the upper portion P1 of the contact material layer 224 may be greater than the width W6 of the lower portion P2 of the contact material layer 224. The upper portion P1 of the contact material layer 224 may be disposed on the top surface of the spacer wall 230 and the top surface of the spacer wall 232. In addition, in the structure of FIG. 1A and the structure of FIG. 2A, the same or similar components are denoted by the same or similar symbols, and the description thereof is omitted.

Referring to FIG. 2B, steps similar to those in FIG. 1B to FIG. 1I can be performed to form the memory structure 20. The difference between the manufacturing method of the memory structure 20 and the manufacturing method of the memory structure 10 is as follows. The manufacturing method of the memory structure 10 may include a process of enlarging the width of the opening 134 so that the width of the opening 134 is enlarged from the width W1 (FIG. 1B) to the width W2 (FIG. 1C). In the manufacturing method of the memory structure 20, the contact material layer 224 is etched to form a contact 224a, and an opening 234 is formed above the contact 224a. Since the contact 224a is formed by removing a part of the upper portion P1 of the contact material layer 224, the contact 224a may have an upper portion P1 and a lower portion P2, and the width W5 of the upper portion P1 of the contact 224a may be greater than the width W6 of the lower portion P2 of the contact 224a. The width W7 of the opening 234 may be greater than the width W5 of the upper portion P1 of the contact 224a. In addition, the width W7 of the opening 234 may be equal to the width W2 of the opening 134. Therefore, the manufacturing method of the memory structure 20 can omit the step of enlarging the width of the opening 134 in the manufacturing method of the memory structure 10. In addition, since the width W5 of the upper portion P1 of the contact 224a may be greater than the width W6 of the lower portion P2 of the contact 224a, the contact area between the electrode 154 and the contact 224a may be increased.

For the remaining steps in the manufacturing method of the memory structure 20, reference may be made to the description of FIG. 1B to FIG. 1I, and no further description is provided here. In addition, in the memory structure 10 of FIG. 1I and the memory structure 20 of FIG. 2B, the same or similar components are denoted by the same or similar symbols, and descriptions thereof are omitted.

In summary, in the memory structure and manufacturing method therefor provided by the disclosure, the first bottom surface of the first electrode is lower than the second bottom surface of the first electrode. In this way, even if overlay shift occurs between the first electrode and the contact structure, it is not easy to form a bridging path between two adjacent contact structures. Therefore, through the above-mentioned structural design of the first electrode, the overlay window between the first electrode and the contact structure can be effectively improved, and electrical defects that are generated due to overlay shift can be prevented.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A manufacturing method for memory structure, comprising:
   forming a bit line structure on a substrate;
   forming a contact structure on the substrate on one side of the bit line structure; and
   forming a capacitor structure on the contact structure, wherein the capacitor structure comprises:
      a first electrode disposed on the contact structure in a misaligned manner relative to the contact structure, and comprising a first bottom surface and a second bottom surface, wherein the first bottom surface is lower than the second bottom surface, and the first bottom surface is disposed on the contact structure;
      a second electrode disposed on the first electrode; and
      an insulating layer disposed between the first electrode and the second electrode, wherein
   the contact structure comprises:
      a first contact disposed on the substrate, wherein a top surface of the first contact is higher than a bottom surface of the bit line structure; and
      a second contact disposed on the first contact, wherein the first contact is located between the second contact and the substrate in a direction perpendicular to the substrate.

2. The manufacturing method for memory structure according to claim 1, further comprising:
   forming a hard mask layer on the bit line structure.

3. The manufacturing method for memory structure according to claim 2, further comprising:
   forming a first spacer wall on a side wall of the contact structure; and
   forming a second spacer wall on the other side wall of the contact structure, wherein a top surface of the hard mask layer is higher than a top surface of the first spacer wall and a top surface of the second spacer wall.

4. The manufacturing method for memory structure according to claim 2, wherein a top surface of the hard mask layer is higher than a top surface of the contact structure, and the second bottom surface is connected to the top surface of the hard mask layer.

5. The manufacturing method for memory structure according to claim 2, wherein the method for forming the second contact comprises:
   forming a contact material layer on the first contact; and
   performing an etching process on the contact material layer to form the second contact, and forming a first opening above the second contact, so that a top surface of the hard mask layer is higher than a top surface of the second contact.

6. The manufacturing method for memory structure according to claim 5, further comprising:
   forming a first spacer layer on a side wall of the contact material layer; and
   forming a second spacer layer on the other side wall of the contact material layer.

7. The manufacturing method for memory structure according to claim 6, further comprising:
   after forming the second contact, removing a part of the first spacer layer and a part of the second spacer layer exposed by the first opening by a wet etching process to form a first spacer wall and a second spacer wall and enlarge a width of the first opening.

8. The manufacturing method for memory structure according to claim 5, wherein a width of an upper portion of the contact material layer is larger than a width of a lower portion of the contact material layer.

9. The manufacturing method for memory structure according to claim 5, wherein the method for forming the first electrode comprises:
   forming a dielectric structure filled in the first opening;
   forming a second opening which exposes a part of the second contact in the dielectric structure; and
   forming the first electrode conformally in the second opening.

10. The manufacturing method for memory structure according to claim 9, wherein the method for forming the first electrode further comprises:
    removing a part of the dielectric structure, and enlarging a width of a bottom of the second opening.

11. The manufacturing method for memory structure according to claim 9, wherein the dielectric structure comprises:
    a first dielectric layer filled in the first opening; and
    a second dielectric layer disposed on the first dielectric layer, wherein an etch rate of a wet etching process performed on the first dielectric layer is larger than an etch rate of the wet etching process performed on the second dielectric layer.

12. The manufacturing method for memory structure according to claim 9, wherein the method for forming the first electrode further comprises:
    before forming the dielectric structure filled in the first opening, forming an etch stop layer conformally on a surface of the first opening, a surface of the hard mask layer, and a surface of the second contact, so that the etch stop layer has a concave and convex structure; and
    after forming the dielectric structure filled in the first opening, removing a part of the etch stop layer so that the second opening exposes a part of the second contact.

13. The manufacturing method for memory structure according to claim 12, wherein the etch stop layer partially covers a top surface of the contact structure and is in direct contact with the first electrode.

14. The manufacturing method for memory structure according to claim 1, wherein the first electrode further comprises:
   a connection surface connected between the first bottom surface and the second bottom surface, wherein a shape formed by the first bottom surface, the connection surface, and the second bottom surface is a stepped shape.

15. The manufacturing method for memory structure according to claim 1, wherein the first bottom surface is connected to a top surface of the contact structure.

16. The manufacturing method for memory structure according to claim 1, wherein the bit line structure comprises:
   a third contact disposed on the substrate; and
   a wire disposed on the third contact.

17. The manufacturing method for memory structure according to claim 1, wherein a width of an upper portion of the second contact is larger than a width of a lower portion of the second contact.

18. The manufacturing method for memory structure according to claim 1, wherein an upper portion of the second contact is disposed on the top surface of the first spacer wall and the top surface of the second spacer wall.

19. The manufacturing method for memory structure according to claim 12, wherein the first electrode is formed on a surface of the etch stop layer, the surface of the hard mask layer, and the surface of the second contact.

* * * * *